United States Patent
Limberg

(10) Patent No.: US 6,519,295 B1
(45) Date of Patent: Feb. 11, 2003

(54) VSB DTV RECEIVER WITH REAL-ONLY DIGITAL SYNCHRODYNE TO RECOVER BASEBAND SYMBOL CODE

(75) Inventor: Allen Leroy Limberg, Vienna, VA (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/232,137

(22) Filed: Jan. 15, 1999

(51) Int. Cl.[7] .......................... H03D 1/24; H04L 27/06; H04N 5/44; H04N 5/50

(52) U.S. Cl. ................. 375/321; 375/344; 348/725; 348/735

(58) Field of Search ................. 375/270, 316, 375/321, 326, 344; 455/202, 203, 204, 192.1, 192.2, 255, 256, 257, 258; 348/725, 726, 735; 329/356, 357

(56) References Cited

U.S. PATENT DOCUMENTS 5,479,449 A * 12/1995 Patel et al. .................. 375/316
5,602,601 A * 2/1997 Kim et al. .................. 348/607
5,606,579 A * 2/1997 Patel et al. .................. 375/321

* cited by examiner

Primary Examiner—Betsy L. Deppe
(74) Attorney, Agent, or Firm—Robert E. Bushnell, Esq.

(57) ABSTRACT

A radio receiver for vestigial sideband digital modulation, such as used for transmitting digital television signals, employs real-only digital synchrodyne circuitry for synchrodyning a real digital carrier with digitized final intermediate-frequency signal to generate an in-phase synchronous detection signal. Digital filtering supplies a complex frequency response to the digitized final intermediate-frequency signal. Further digital synchrodyne circuitry synchrodynes this complex frequency response with a complex digital carrier to generate a quadrature-phase synchronous detection signal. This quadrature-phase synchronous detection signal is used in automatic frequency and phase control of a local oscillator used in the conversion of received signal to the final intermediate-frequency signal for digitization.

21 Claims, 8 Drawing Sheets

US 6,519,295 B1

VSB DTV RECEIVER WITH REAL-ONLY DIGITAL SYNCHRODYNE TO RECOVER BASEBAND SYMBOL CODE

The invention relates to digital television receivers for vestigial-sideband (VSB) digital television (DTV) signals and, more particularly, to the portions of such receivers used for recovering baseband symbol coding proceeding from intermediate-frequency signals.

BACKGROUND OF THE INVENTION

Bandpass trackers for VSB DTV signal receivers are described by C. B. Patel and the inventor in U.S. Pat. No. 5,479,449 issued Dec. 26, 1995 and entitled "DIGITAL VSB DETECTOR WITH BANDPASS PHASE TRACKER, AS FOR INCLUSION IN AN HDTV RECEIVER". In U.S. Pat. No. 5,479,449 VSB DTV signal in a final intermediate-frequency band is digitized before being synchrodyned to baseband in a digital demodulation procedure designed to reproduce the transmitted baseband symbol code. U.S. Pat. No. 5,479,449 describes the use of narrow bandpass filters to convert the digitized VSB DTV signal in that final I-F band to a digital narrow-band double-sideband amplitude-modulation (DSB AM) signal. The narrow-band DSB AM signal is synchrodyned to baseband in the digital regime for recovering an automatic-frequency-and-phase-control (AFPC) signal for a local oscillator that generates local oscillations used in detecting the VSB amplitude modulation to generate the final I-F signal. U.S. Pat. No. 5,479,449 also describes alternative bandpass trackers for VSB DTV signal receivers which do not use a narrow bandpass filter to convert the digitized VSB DTV signal to a digital narrow-band DSB AM signal, but instead extract the AFPC signal for the local oscillator from the response of a narrowband lowpass filter to the quadrature-phase component of the result of complex synchrodyning of the VSB DTV signal to baseband. This alternative type of bandpass tracker has been favored because the narrowband filtering of the AFPC signal can be carried out in the analog regime, without employing a digital filter of considerable complexity.

The digital synchrodyning procedure used in U.S. Pat. No. 5,479,449 for the in-phase demodulation of the VSB DTV signal to recover baseband symbol code employs a complex digital multiplier. The digital synchrodyning procedure used in U.S. Pat. No. 5,479,449 for the quadrature-phase demodulation of the VSB DTV signal to develop the AFPC signal employs another complex digital multiplier. These complex digital multipliers each receive a complex multiplicand signal comprised of the digitized final I-F signal and its Hilbert transform, as developed by digital filtering. These complex digital multipliers receive respective complex multiplier signals from a read-only memory (ROM) addressed from a sample counter counting at a rate in a prescribed ratio to the VSB DTV signal baud rate, which complex multiplier signals are orthogonal to each other.

The design of digital filtering to generate an accurate Hilbert transform response over a five to six megahertz bandwidth is a formidable problem, particularly if the lower end of the passband is closer to zero-frequency than one megahertz or so. Because of this, bandpass trackers for VSB DTV signal receivers have used a final I-F signal with a carrier above one megahertz with a full-band sideband extending upward therefrom in frequency and a vestigial sideband extending downward therefrom in frequency. Alternatively, bandpass trackers for VSB DTV signal receivers have used a final I-F signal with a carrier more than a megahertz above the 5.38 megahertz one-half baud rate with a full-band sideband extending downward therefrom in frequency and a vestigial sideband extending upward therefrom in frequency.

A complex digital multiplier comprises four component four-quadrant digital multipliers, a digital subtractor and a digital adder. Practically speaking, one-half of such a complex digital multiplier is a necessity in the synchrodyning procedure used for developing AFPC signal for the local oscillator that generates local oscillations used in detecting the VSB amplitude modulation to generate the final I-F signal. Otherwise, the AFPC loop exhibits low gain when carrier phasing is at the edges of a pull-in range, that can lead to an undesirable lack of stable phase lock in this feedback loop. The controlled local oscillator preferably has exceptional frequency stability in the absence of a fed-back AFPC error signal, which stability is achievable using crystal frequency stabilization. If the frequency of the local oscillator is far enough from carrier frequency to fall within the narrow spectral width of the vestigial sideband, the energy required for pull-in and lock-in of the AFPC loop is very likely to be unavailable. The bandwidth of the AFPC loop is designed to be quite narrow, almost certainly less than ±300 kilohertz at most, generally much less.

The design of digital filtering to generate an accurate Hilbert transform response over this limited frequency range can be a substantially simpler problem than the design of digital filtering to generate an accurate Hilbert transform response over a five to six megahertz bandwidth, the inventor observes. This is especially so if the VSB DTV carrier as translated to the final I-F band is 5.38 MHz or more.

The inventor further observes that if the AFPC loop carries out its appointed function, there is no need for a complex digital multiplier in the synchrodyning procedure used for demodulating the VSB DTV signal to reproduce the transmitted baseband symbol code. The AFPC of the local oscillator permits a real-only digital carrier to multiply a real-only final I-F signal in a single four-quadrant digital multiplier. That is, there is no need for two component four-quadrant digital multipliers and a digital adder; and there is no need for Hilbert transform filtering to generate an imaginary component of digital I-F signal for demodulating the VSB DTV signal to reproduce the transmitted baseband symbol code. This provides for considerable simplification in the bandpass tracker structure.

SUMMARY OF THE INVENTION

The invention is embodied in a receiver for a baseband symbol code that is designed to have a spectrum reaching at least substantially to zero-frequency and that is transmitted by vestigial-sideband amplitude modulation of a suppressed carrier wave. The receiver includes a local oscillator for generating local oscillations used in detecting the vestigial-sideband amplitude modulation. A mixer is included in the receiver to heterodoxy the local oscillations with vestigial-sideband amplitude modulation of a suppressed carrier wave to generate a final intermediate-frequency signal. The receiver includes an analog-to-digital converter to digitize the final intermediate-frequency signal. The receiver is characterized by real-only digital synchrodyne circuitry for synchrodyning a real digital carrier with the digitized final intermediate-frequency signal to generate an in-phase synchronous detection signal.

In preferred embodiments of the invention the local oscillator is one which has the frequency and phase of its local oscillations subject to automatic-frequency-and-phasecontrol (AFPC). Digital filtering is included in such a preferred receiver for supplying a complex frequency response to the digitized final intermediate-frequency signal, with improved symmetry of channel response in a narrow-frequency band including the pilot carrier signal. Further digital synchrodyne circuitry is included in such a preferred receiver for multiplying the complex frequency response to the digitized final intermediate-frequency signal by a complex digital carrier in half a complex multiplication operation that generates a quadrature-phase synchronous detection signal. Automatic-frequency-and-phase-control circuitry responsive to an error signal extracted from the quadrature-phase synchronous detection signal completes an automatic frequency and phase control (AFPC) loop in such a preferred receiver for controlling the frequency and phase of the controlled local oscillator so as to minimize the error signal.

BRIEF DESCRIPTION OF THE DRAWING

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION

At various points in the circuits shown in the FIGURES of the drawings, shimming delays have to be inserted in order that the sequence of operation is correct, as will be understood by those skilled in electronic design. Unless there is something extraordinary about a particular shimming delay requirement, it will not be explicitly referred to in the specification that follows.

Figure 1:
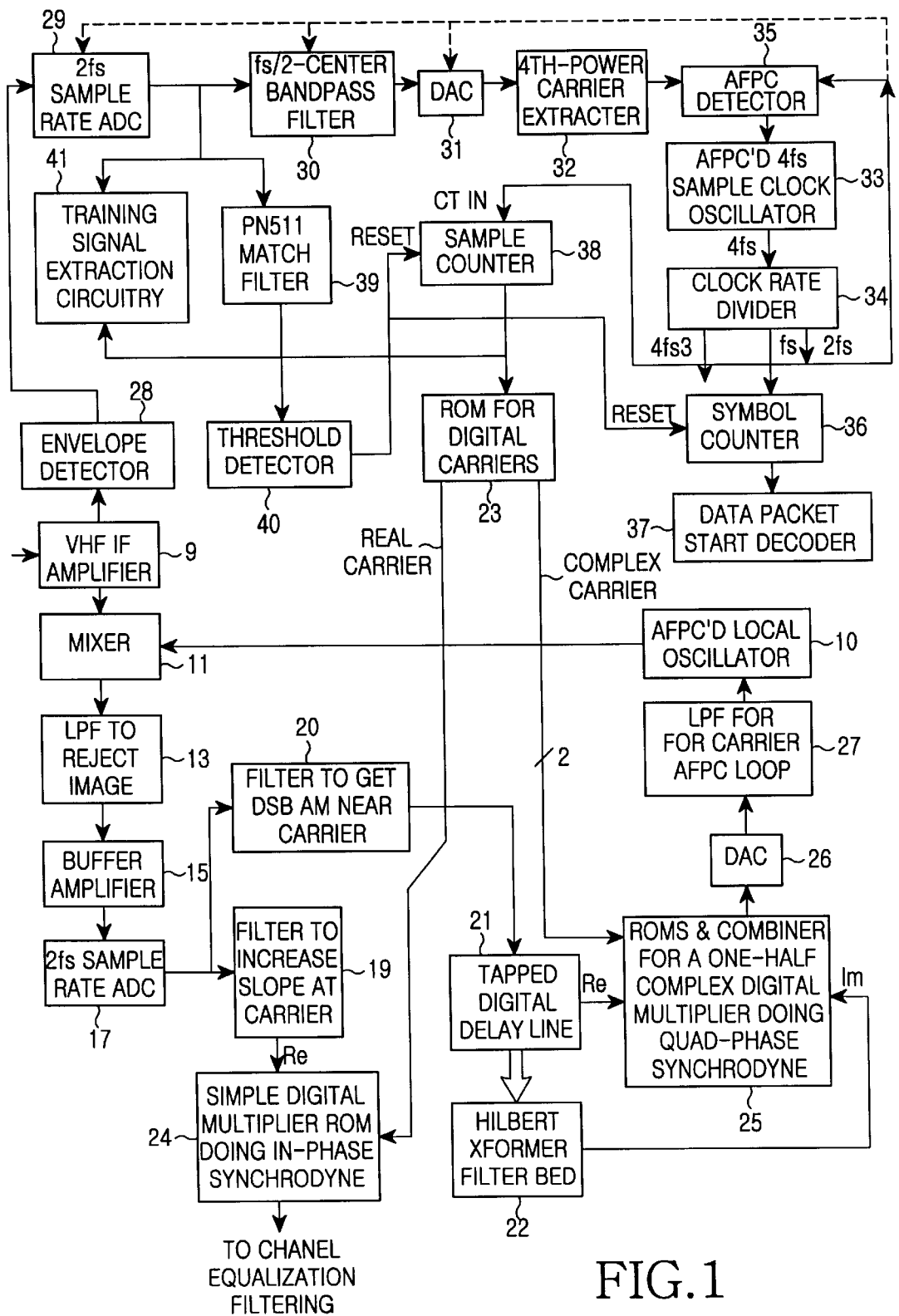
FIG. 1 is a block schematic diagram of portions of a vestigial-sideband digital television receiver embodying the invention, which VSB DTV receiver portions generate final intermediate-frequency signals synchrodyned to baseband in the digital regime at twice the baud rate, using read-only memories addressed by the final intermediate-frequency signals and by digital carrier signals supplied by a further read-only memory addressed by a count output from a sample counter.

FIG. 1 shows portions of a VSB DTV receiver operated with a sampling clock of a frequency 2 fs, which is twice the 10.76 Mhz symbol frequency fs used in the received VSB DTV signals. A VSB DTV signal received over a transmission channel in the ultra-high-frequency (UHF) band typically is superheterodyned to UHF intermediate-frequency signal in an initial upconversion. Surface-acoustic-wave (SAW) filtering on gallium-arsenide substrates facilitates the suppression of adjacent channel signals. The SAW filter response is usually downconverted to a very-high-frequency intermediate-frequency signal. FIG. 1 shows a very-high-frequency intermediate-frequency amplifier 9 receiving this VHF I-F signal as input signal. The VHF I-F amplifier 9 contains a number of automatic-gain-controlled amplifier stages and supplies an output signal of controlled amplitude to a first mixer 11 for downconversion to a final intermediate-frequency signal in a medium- and high-frequency band in the range of one to ten megahertz. A local oscillator 10 supplies an in-phase carrier at a frequency somewhat above the VHF I-F band to the first mixer 11 for implementing the downconversion of the VHF I-F amplifier 9 output signal. The frequency and phase of the oscillations from this local oscillator 10 are subject to automatic frequency and phase control (AFPC). The AFPC of the oscillator 10 implements sampling of the VHF I-F signal at prescribed phases of the carrier when digitizing that VHF I-F signal.

A lowpass analog filter 13 selects the final intermediate-frequency signal from the output signal of the mixer 11 and suppresses the image of the final intermediate-frequency signal in the input signal supplied to a buffer amplifier 15. The buffer amplifier 15 supplies its output signal to an analog-to-digital converter 17 in response to the output signal of the filter 13. The ADC 17 samples at a rate 2 fs twice the baud rate fs, when digitizing the final I-F signal.

The digitized real final I-F signal supplied from the ADC 17 is supplied to digital filter 19, which cuts off the frequency response to this component near carrier frequency in preparation for synchrodyning it to baseband for recovering baseband symbol code. If the carrier of the VSB DTV signal appears in the upper frequencies of the final I-F signal supplied from the ADC 17, the digital filter 19 can be a lowpass finite-impulse-response digital filter. If the carrier of the VSB DTV signal appears in the lower frequencies of the final I-F signal supplied from the ADC 17, the digital filter 19 can be a highpass finite-impulse-response digital filter. The FIR digital filter 19 supplies a final I-F signal response that is 3 dB down at final I-F carrier frequency.

The filter 19 can be designed to provide a response that provides Nyquist slope roll-offs that are 3 dB down at 5.38 MHz from the final I-F carrier frequency. However, it is preferable to develop the Nyquist slope roll-offs earlier in the DTV receiver. The VHF I-F amplifier 9 can include a surface-acoustic-wave (SAW) filter that provides a Nyquist slope roll-off that is 3 dB down at 5.38 MHz from the VHF I-F carrier frequency, for example. Preferably, a pilot carrier is not attenuated by the I-F roll-off for rejecting a carrier-side adjacent-channel signal, particularly an adjacent-channel NTSC sound signal. This better maintains the pilot carrier larger than noise during digitization in the ADC 17, better to avoid jitter in the AFPC loop.

Developing the Nyquist slope roll-offs earlier in the DTV receiver means the digital filter 19 need cut-off only at one end of the final I-F passband, the carrier end, in order to approximate correct roll-off through the carrier region. The design of the digital filter 19 to provide this roll-off is simpler if the final I-F signal is generated so as to place the carrier at the lower-frequency end of the final I-F passband. However, the ROM 23 needs to be larger in order to generate digital carriers at lower frequency.

The digitized final I-F signal supplied from the ADC 17 is supplied to a digital filter 20, which generates a response in which the amplitude-modulation sidebands are symmetrical around the carrier, over a frequency band somewhat wider than the lock in range of the AFPC loop. That is, the modulation near carrier is double-sideband amplitude modulation (DSB AM), so the responses to the upper and lower sidebands near carrier will cancel when quadrature-phase synchrodyning of the complex final I-F signal to baseband for recovering a signal from which to extract the AFPC signal for the local oscillator 10. If the carrier of the VSB DTV signal appears in the lower frequencies of the real final I-F signal supplied from the ADC 17, the digital filter 20 can be a lowpass finite-impulse-response digital filter. If the carrier of the VSB DTV signal appears in the upper frequencies of the real final I-F signal supplied from the ADC 17, the digital filter 20 can be a highpass finite-impulse-response digital filter. The response of the digital filter 20 is supplied to a tapped digital delay line 21, which generates the successively delayed samples of the digitized final I-F signal that are weighted by a bed 22 of respective multiplier weights in a weighted summation procedure that generates a Hilbert transform response to the digitized final I-F signal. This Hilbert transform response and a correspondingly delayed digitized final I-F signal from a median tap of the tapped digital delay line 21 provide a complex final I-F signal to be synchrodyned to baseband for generating an error signal for the feedback loop applying AFPC to the local oscillator 10.

In FIG. 1 a read-only memory 23 supplies a real digital carrier to in-phase synchrodyne circuitry 24 for synchrodyning the real final I-F signal to baseband in the digital regime for recovering digitized baseband symbol coding. The read-only memory 23 supplies a complex digital carrier to quadrature-phase synchrodyne circuitry 25. The in-phase synchrodyne circuitry 24 is a simple digital multiplier that multiplies the response of the digital filter 19, received as a real multiplicand input signal, by a real digital carrier, received from the ROM 23 as a real multiplier input signal. This is done to recover baseband symbol code as the real component of the product output signal, which baseband symbol code is forwarded to baseband channel-equalization and ghost-cancellation filter circuitry not shown in FIG. 1. FIG. 1 shows the simple digital multiplier constituting the in-phase synchrodyne circuitry 24 is constructed as a read-only memory (ROM) storing an appropriate look-up table, which multiplier structure is preferred for low-latency multiplication.

In FIG. 1 the read-only memory 23 supplies a complex digital carrier to quadrature-phase synchrodyne circuitry 25 for synchrodyning the complex final I-F signal received from elements 21 and 22 to baseband. This synchrodyning is performed in the digital regime to generate a quadrature-phase synchronous detection signal, from which AFPC signal for the local oscillator 10 is developed. The quadrature-phase synchrodyne circuitry 25 is a one-half complex digital multiplier that multiplies the complex multiplicand input signal, received from elements 21 and 22, by the complex digital carrier, received from the ROM 23 as a complex multiplier input signal. This is done to recover an imaginary component of the product output signal from which an automatic frequency and phase control (AFPC) signal for the local oscillator 10 is extracted.

FIG. 1 indicates that each of the component digital multipliers of the quadrature-phase synchrodyne circuitry 25, included for generating the imaginary component of the product output signal, is a respective ROM storing an appropriate look-up table, which component multiplier structure is preferred for low-latency multiplication. The linear combiner used for combining the partial products from these ROMs to form the output signal of the quadrature-phase synchrodyne circuitry 25 is a digital subtractor or is a digital adder, depending on the phases of the component digital carrier respectively used for addressing the ROMs. Embodiments of the invention are possible in which a single ROM replaces both the component digital multipliers and the subtractor that the quadrature-phase synchrodyne circuitry 25 includes, to be used in generating the imaginary component of the product output signal, but the monolithic integrated-circuit structure to do this takes up more area on a semiconductor die.

The digital output signal of the quadrature-phase synchrodyne circuitry 25, corresponding to the imaginary component of the complex product output signal, is supplied to a digital-to-analog converter 26 for conversion to an analog signal applied as input signal to a lowpass analog filter 27. The response of the lowpass analog filter 27 is supplied to the local oscillator 10 as its automatic frequency and phase control (AFPC) signal. The AFPC signal is operative to adjust the frequency and phase of the oscillations of the local oscillator 10 to zero the imaginary output signal from the quadrature-phase synchrodyne circuitry 25. This maximizes the direct component of the real output signal from the in-phase synchrodyne circuitry 24, presuming the respective complex multiplications carried out in the in-phase synchrodyne circuitry 24 and in the quadrature-phase synchrodyne circuitry 25 are performed contemporaneously, with suitably timed respective multiplicand input signals and suitably timed respective multiplier input signals.

Designs arranging for the carrier of the VSB DTV signal to appear in the upper frequencies of the complex final I-F signal supplied from the ADC 17 should be considered for another reason besides reduction in the size of ROM 23. The filter 19 is then a digital lowpass filter that suppresses noise at frequencies above the vestigial sideband that originates in the VHF I-F amplifier 9 and otherwise would accompany the complex final I-F signal supplied to the in-phase synchrodyne circuitry 24. Such noise would be synchrodyned to baseband where it would undesirably be superposed on baseband symbol coding. Designing the lowpass analog filter 13 with a cut-off frequency low enough to suppress the noise at frequencies above the vestigial sideband that originates in the VHF I-F amplifier 9 is infeasible because uniform delay in phase response near the final I-F carrier is practically impossible to achieve. Linear phase response is achieved in FIR digital filters 19, 20 and 22 simply by using symmetrical kernels. The spectrum folding that attends synchrodyning then tends to result in flat spectral response near zero frequency. This lessens the number of taps required in the baseband channel equalization filtering to permit sufficient low-frequency adjustments to overcome the effects of non-uniform delay in phase response near the final I-F carrier.

The fact that one need not provide Hilbert transformation of the real final I-F signal supplied to the in-phase synchrodyne circuitry 24 makes it feasible to place the carrier frequency of this signal at a frequency one-half baud rate, which is to say 5.38 MHz. The aliasing of the Nyquist slope of the real final I-F signal at frequencies remote from 5.38 MHz can then flatten the spectral response of the channel near its upper boundary frequency, without concern for inadequacy in Hilbert transform filter low-frequency response.

In order for the bandpass tracker apparatus to automatically sample at a prescribed carrier phasing when digitizing a VSB I-F signal, synchronization of the sampling circuitry to a baud rate of a received VSB DTV signal is done independently of the bandpass tracker apparatus. Such synchronization can be achieved using the spectral line method for passband signals, sometimes referred to as "envelope derived timing".

FIG. 1 shows the apparatus for implementing a preferred spectral line method. An envelope detector 28 is used for detecting the envelope variations of the VHF I-F signal supplied from the VHF I-F amplifier 9. Detecting the envelope variations of the VHF I-F signal, rather than the envelope variations of the final I-F signal in the low- and medium-frequency band, simplifies the filtering to suppress carrier remnants in the envelope detector output signal. An analog-to-digital converter 29 samples the envelope detector output signal at the rate 2 fs, twice the baud rate fs, to generate an input signal for an FIR digital bandpass filter 30. The digital bandpass filter 30 has a passband centered at fs/2 for extracting a spectral line near 5.38 MHz. The 2 fs sample rate in the ADC 29 samples the fs/2 spectral line component four times per cycle so that complete phase information is preserved in the digital samples that the FIR digital bandpass filter 30 supplies to a digital-to-analog converter 31. The analog output signal from the DAC 31 containing the fs/2 spectral line selected by the digital bandpass filter 30 is supplied to a non-linear circuit 32 that generates an output signal that is the fourth power of that spectral line. By way of example, the non-linear circuit 32 comprises a cascade of two analog squaring circuits with respective resistance-coupled output ports; several equivalents are known in the art.

A sample clock oscillator 33 oscillates at 4 fs and supplies its oscillations to a clock rate divider network 34 that generates sampling clock signals at the fs sample rate and the 2 fs sample rate. If sampling clock signals at 4 fs/3 sample rate are used in fractional channel equalization filtering of the in-phase synchrodyne circuitry 24 output signal, the clock rate divider network 34 is designed to generate these sampling clock signals as well. An automatic frequency and phase detector 35 applies an automatic frequency and phase (AFPC) signal to the sample clock oscillator 33 for synchronizing its oscillations with symbols of the currently received VSB DTV signal. More particularly, the 2 fs sample rate signal from the clock rate divider network 34 is supplied to the AFPC detector 35 for comparison with the non-linear circuit 32 output signal. The non-linear circuit 32 output signal is a 2 fs signal that is the fourth power of the fs/2 spectral line selected by the digital bandpass filter 30. The AFPC loop, comprising elements 33, 34 and 35, locks the 2 fs sample rate signal from the clock rate divider network 34 in quadrature phase with the 2 fs output signal from the non-linear circuit 32.

An unusual feature in the spectral line separation employed in FIG. 1 is the use of the FIR digital bandpass filter 30 for selecting the fs/2 spectral line, rather than the analog bandpass filter used in the prior art. The FIR digital bandpass filter 30 is a tracking filter, since the center frequency of its passband is determined by the frequency of the sample clock oscillator 33 oscillations. The sample clock oscillator 33 is a stable oscillator, typically being crystal stabilized, and its AFPC range is small enough to avoid phase locking to the fs/3 or fs/4 spectral line in the envelope detector output signal. The use of an FIR digital bandpass filter 30 eliminates the phase shifting close to the fs/2 spectral line that is a problem with a narrowband analog bandpass filter. The digital-to-analog conversion of the digital bandpass filter 30 response avoids having to sample at more than the 2 fs sample rate. If harmonics of the fs/2 spectral line are generated in the digital regime, a higher sampling rate is required in order not to undersample the harmonic components. Alternative designs are possible in which the clock rate divider network 34 is modified to generate sampling clock signals at the fs/2 sample rate to be compared with the fs/2 spectral line in the DAC 31 output signal in a modified AFPC detector 35. However, care must be taken to forestall jitter between the sampling clock signals which tends to arise in the chain of flip-flops used in the clock rate divider network 34. Ripple carry should be avoided in favor of clocked state transitions, for example.

Synchronization using the spectral line method for passband signals is not readily compatible with synchronization using data segment synchronization (DSS) codes as described by R. W. Citta, D. M. Mutzabaugh and G. J. Sgrignoli in U.S. Pat. No. 5,416,524 issued May 16, 1995 and entitled "DIGITAL TELEVISION SYNCHRONIZATION SYSTEM AND METHOD". In U.S. Pat. No. 5,602,595 issued Feb. 11, 1997 and entitled "ATV/MPEG SYNC SYSTEM" R. W. Citta, M. Fimoff and T. G. Laud describe the detection of DSS codes for signaling the ends of MPEG-II data packets. The DSS codes are unnecessary overhead when the spectral line method for passband signals is used for synchronization.

The fs sample rate signal from the clock rate divider network 34 is supplied to a symbol counter 36 for counting the symbols in a prescribed number of data fields. The count from the symbol counter 36 is decoded by data packet start decoders 37 for determining the starts of data packets, such as MPEG-2 data packets. This decoding is facilitated by the counter stages that determine the less significant bits of the symbol counter 36 count being arranged to count modulo-832 and the counter stages that determine the more significant bits of the symbol counter 36 count being arranged to count data segments.

The 2 fs sample rate signal from the clock rate divider network 34 is supplied to a sample counter 38 for counting the 2 fs-rate samples in a prescribed number of data fields. Less significant bits of the count are used to address the ROM 23 that generates the complex digital carrier supplied to the synchrodyne circuitry 24 as its multiplier input signal and supplied to the synchrodyne circuitry 25 as its multiplier input signal. If the final I-F carrier frequency is suitably chosen modifications of the FIG. 1 circuitry that dispense with the symbol counter 38 are possible. In such modified circuitry the more significant bits of the sample count supplied from the sample counter 38 at 2 fs rate are used to provide symbol count at fs rate.

FIG. 1 shows the envelope detector 28 response as digitized at 2 fs sample rate by the ADC 29 being supplied as input signal to a PN511 match filter 39. When a PN511 sequence occurs in the initial data segment of a data field, unless there is too much interfering noise the PN511 match filter 39 response will become large enough to be detected by a threshold detector 40 thereby generating a reset command for the counters 36 and 38. The counters 36 and 38 are designed to continue counting until such a reset command is supplied even if that takes a few data fields. The counters 36 and 38 are preferably designed to count samples for a plurality of data frames before the count rolls over, to implement the operation of training signal extraction circuitry 41.

The envelope detector 28 response as digitized at 2 fs sample rate by the ADC 29 is applied to the training signal extraction circuitry 41 as its input signal. The training signal extraction circuitry 41 is conditioned by certain sample counts from the sample counter 38 to extract a training signal for the channel equalization filtering from the data field synchronization codes in the initial data segments of data fields. Accumulation of training signal samples over a cycle of six data fields or a plurality of such cycles helps suppress artifacts of NTSC co-channel interference.

A substantial difference of the ROM 23 used in the FIG. 1 circuitry from the complex-digital-carrier ROM used in the phase tracker described in U.S. Pat. No. 5,479,449 is that only one particular phasing of the complex carrier used by the quadrature-phase synchrodyne circuitry 25 is stored, rather than several phasings of the complex carrier being stored. Additionally, only one particular phasing of the real carrier used by the in-phase synchrodyne circuitry 24 is stored.

Figure 2:
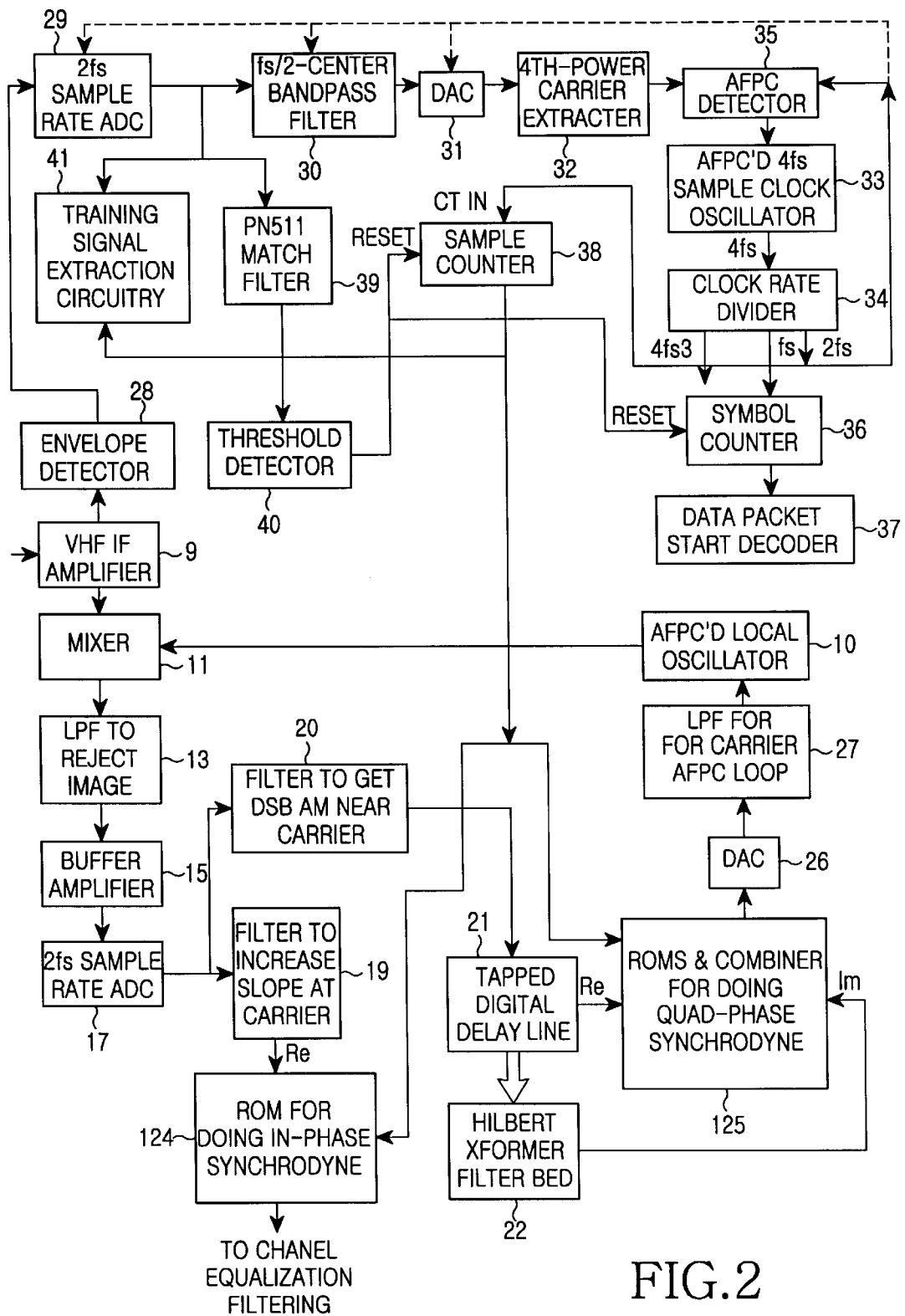
FIG. 2 is a block schematic diagram of portions of a vestigial-sideband digital television receiver embodying the invention, which VSB DTV receiver portions generate final intermediate-frequency signals synchrodyned to baseband in the digital regime at twice the baud rate, using read-only memories addressed by the final intermediate-frequency signals and by a count output from a sample counter.

FIG. 2 shows a modification of the FIG. 1 portions of a VSB DTV receiver which eliminates the ROM 23 altogether. The FIG. 1 in-phase synchrodyne circuitry 24 includes a ROM used to implement a simple digital multiplier for multiplying the filter 19 response by a digital carrier. The ROM in circuitry 24 is addressed by the filter 19 response and by a real digital carrier value from the carrier ROM 23, which ROM 23 is addressed by less significant bits of a sample count from the sample counter 38. In the in-phase synchrodyne circuitry 124 of FIG. 2, the ROM in circuitry 24 of FIG. 1 is replaced by a read-only memory addressed by the filter 19 response and the less significant bits of the sample count from the sample counter 38, the ROM 23 of FIG. 1 having been removed in FIG. 2. This avoids any rounding errors in the digital carrier values that would be supplied from the ROM 23.

Read-only memory circuitry addressed by the complex digital carrier values from the carrier ROM 23 and by the delayed filter 20 response or its Hilbert transform in the FIG. 1 quadrature-phase synchrodyne circuitry 25 are replaced in the FIG. 2 quadrature-phase synchrodyne circuitry 125 by read-only memory circuitry addressed by the delayed filter 20 response or its Hilbert transform and by the less significant bits of the sample count from the sample counter 38 used in FIG. 1 to address the ROM 23. This avoids any rounding errors in the digital carrier values that would be supplied from the ROM 23.

The ROM in the FIG. 2 in-phase synchrodyne circuitry 124, if larger than the ROM in the FIG. 1 in-phase synchrodyne circuitry 24, is not apt to be substantially larger and will be smaller in some instances. Also, the ROM circuitry in the FIG. 2 quadrature-phase synchrodyne circuitry 125, if larger than the ROM in the FIG. 1 quadrature-phase synchrodyne circuitry 25, is not apt to be appreciably larger and will be smaller in some instances. Since the ROM 23 used in the FIG. 1 receiver circuitry is dispensed with in the FIG. 2 receiver circuitry, there will generally be an overall saving in the amount of ROM required.

Figure 3:
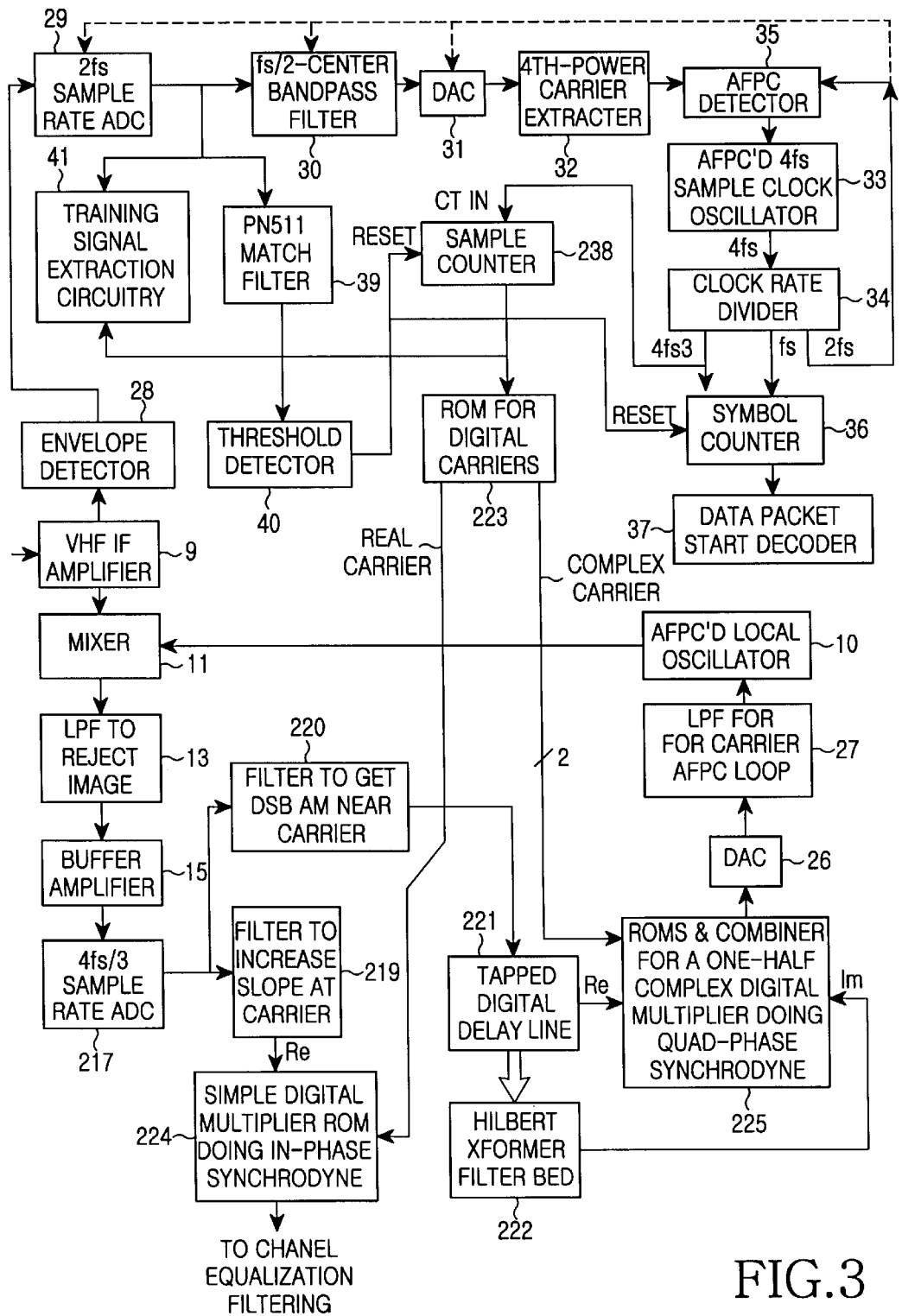
FIG. 3 is a block schematic diagram of portions of a vestigial-sideband digital television receiver embodying the invention, which VSB DTV receiver portions generate final intermediate-frequency signals synchrodyned to baseband in the digital regime at four-thirds the baud rate, using read-only memories addressed by the final intermediate-frequency signals and by digital carrier signals supplied by a further read-only memory addressed by a count output from a sample counter.

FIG. 3 shows a modification of the FIG. 1 portions of a VSB DTV receiver in which the complex final I-F signals are digitized at four-thirds (4 fs/3) the baud rate, rather than twice (2 fs) the baud rate, for demodulation in the digital regime. Elements identified by reference numbers beginning with a two (hundred) prefix are clocked at four-thirds the baud rate, but correspond in function to elements identified by the same reference numbers without the prefix, which are clocked at twice the baud rate. The sample counter 238 counts samples at four-thirds baud rate for addressing digital carrier ROM 223 that stores look-up tables of real and complex digital carriers sampled at four-thirds baud rate.

Figure 4:
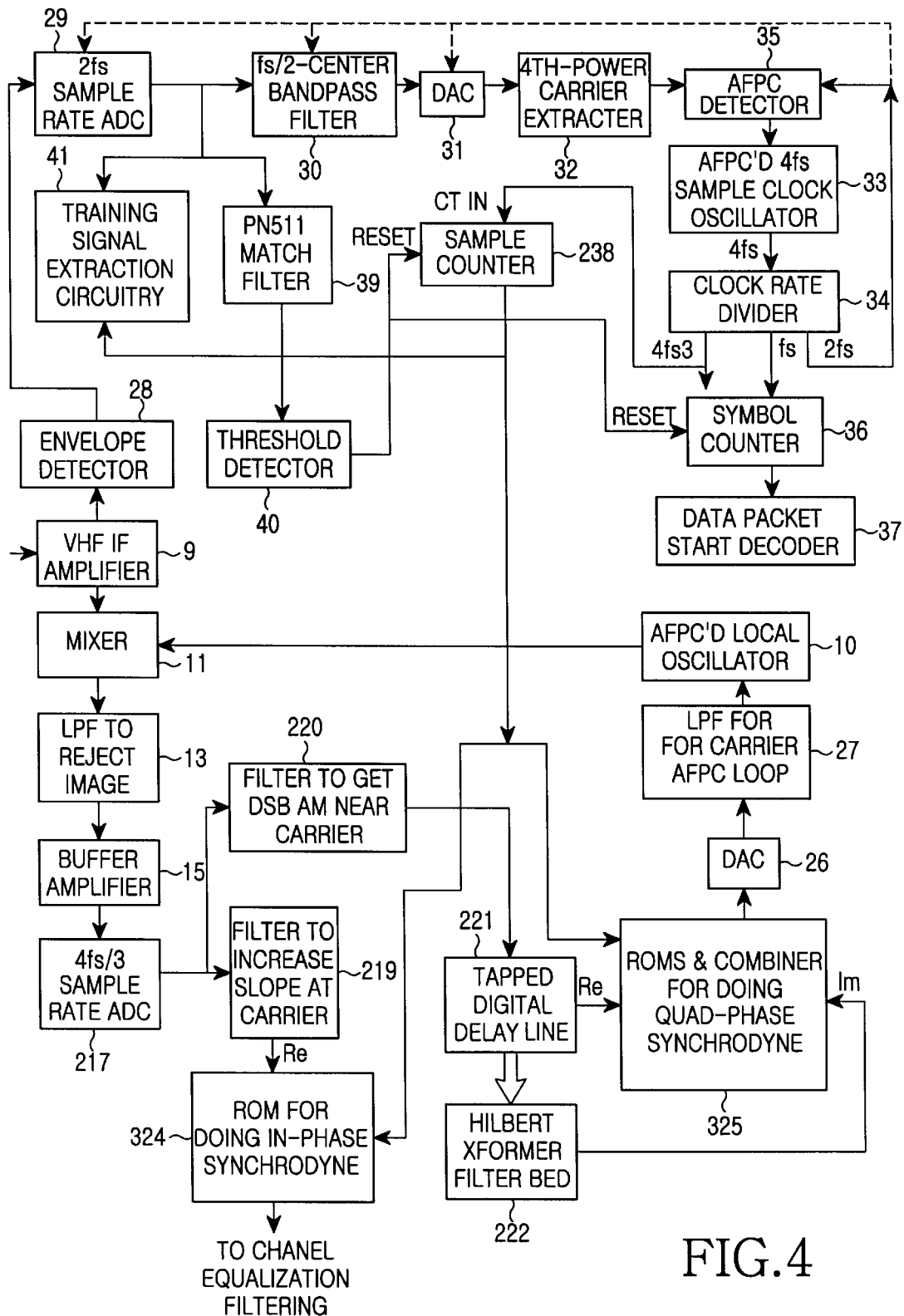
FIG. 4 is a block schematic diagram of portions of a vestigial-sideband digital television receiver embodying the invention, which VSB DTV receiver portions generate final intermediate-frequency signals synchrodyned to baseband in the digital regime at four-thirds the baud rate, using read-only memories addressed by the final intermediate-frequency signals and by a count output from a sample counter.

FIG. 4 shows a modification of the FIG. 3 portions of a VSB DTV receiver which eliminates the ROM 223 used for storing look-up tables of real and complex digital carrier sampled at four-thirds baud rate. The FIG. 3 in-phase synchrodyne circuitry 224 includes a ROM used to implement a simple digital multiplier for multiplying the filter 219 response by the real digital carrier sampled at four-thirds the baud rate, the ROM in circuitry 224 being addressed by the filter 219 response and by the real digital carrier values from the carrier ROM 223, which ROM 223 is addressed by less significant bits of the sample count from the sample counter 238. In the in-phase synchrodyne circuitry 324 of FIG. 4, the ROM in circuitry 224 of FIG. 3 is replaced by a read-only memory addressed by the filter. 219 response and the less significant bits of the sample count from the sample counter 238, the ROM 223 of FIG. 3 having been removed in FIG. 4. This avoids any rounding errors in the digital carrier values that would be supplied from the ROM 223.

Read-only memory circuitry addressed by complex digital carrier values from the carrier ROM 223 and by the delayed filter 230 response or its Hilbert transform in the FIG. 3 quadrature-phase synchrodyne circuitry 225 are replaced in the FIG. 4 quadrature-phase synchrodyne circuitry 325 by read-only memory circuitry addressed by the delayed filter 220 response or its Hilbert transform and by the less significant bits of the sample count from the sample counter 238 used in FIG. 3 to address the ROM 223. This avoids any rounding errors in the digital carrier values that would be supplied from the ROM 223.

In preferred embodiments of the FIG. 3 and FIG. 4 receiver portions, the final I-F carrier frequency is caused to be two-thirds the baud rate or 7.17 MHz. If the carrier of the final I-F signal is at 7.17 MHz, the four-thirds baud rate sampling by ADC 217 aliases the vestigial sideband into the full sideband, supposing the anti-aliasing filtering normally included in the ADCs has a high enough cut-off frequency. This facilitates channel equalization.

Figure 5:
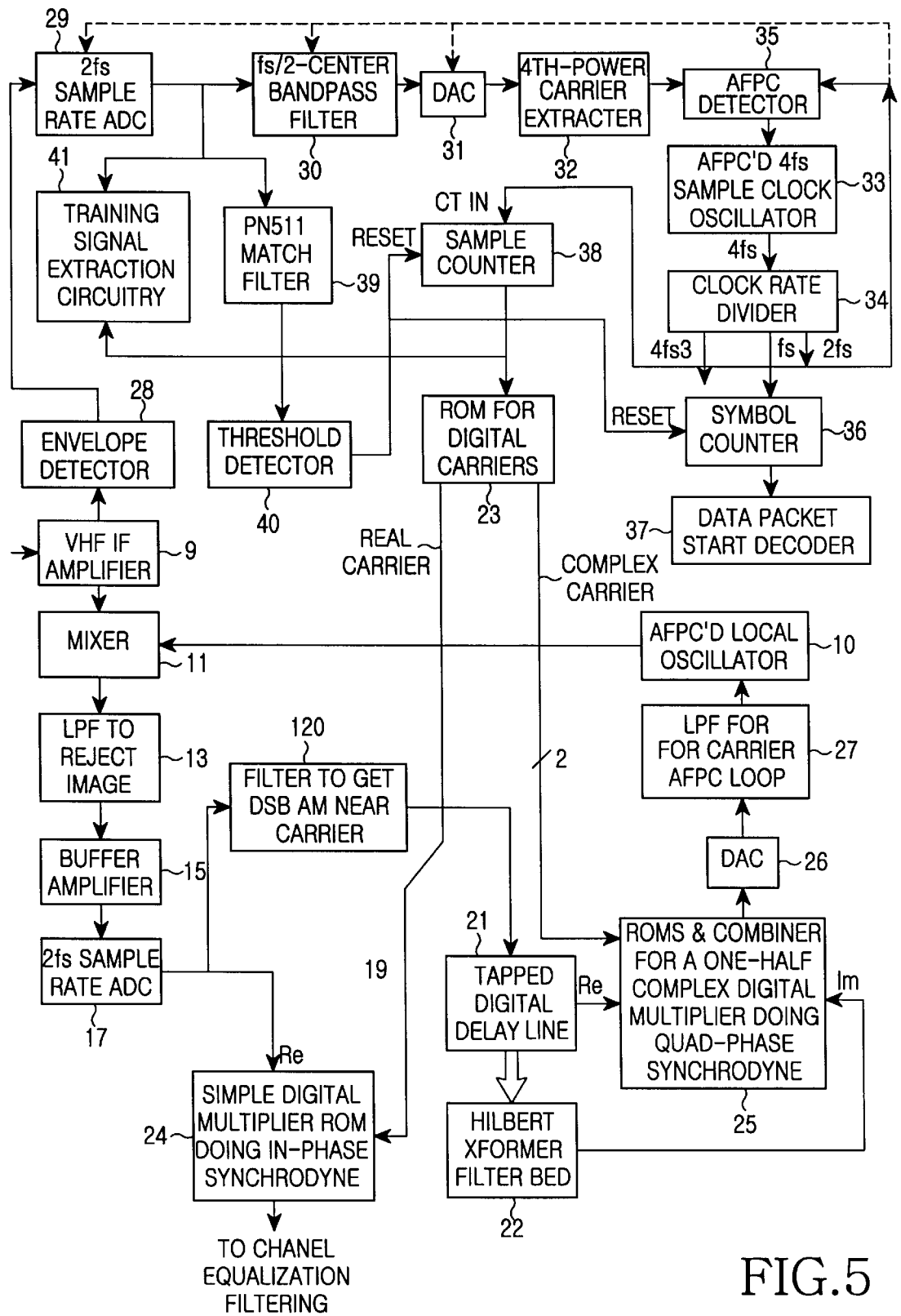
FIGS. 5, 6, 7 and 8 are block schematic diagrams of variants of the portions of a vestigial-sideband digital television receiver respectively shown in FIGS. 1, 2, 3 and 4, in which variants the filtering that determines a very-high-frequency intermediate-amplifier passband establishes a slope through the carrier region of the final I-F signal supplied for in-phase synchrodyning to baseband in order to reproduce transmitted symbol coding.

FIG. 5 shows a modification of the FIG. 1 portions of a VSB DTV receiver to be used in designs in which the filtering that determines the VHF intermediate-amplifier passband establishes the slope through the carrier region of the final I-F signal supplied to in-phase synchrodyne circuitry 24. The ADC 17 output signal is supplied to the in-phase synchrodyne circuitry 24 for demodulation without the spectral response of the ADC 17 output signal being further rolled off in the carrier region by the filter 19. The filter 20 used to obtain a flat spectrum through the carrier region to improve the response of the AFPC loop including the quadrature-phase synchrodyne circuitry 25 is replaced by a filter 120 that reduces roll-off of the vestigial sideband response even more, to compensate for the roll-off in the VHF I-F amplifier as well as the roll-off at the transmitter.

Figure 6:
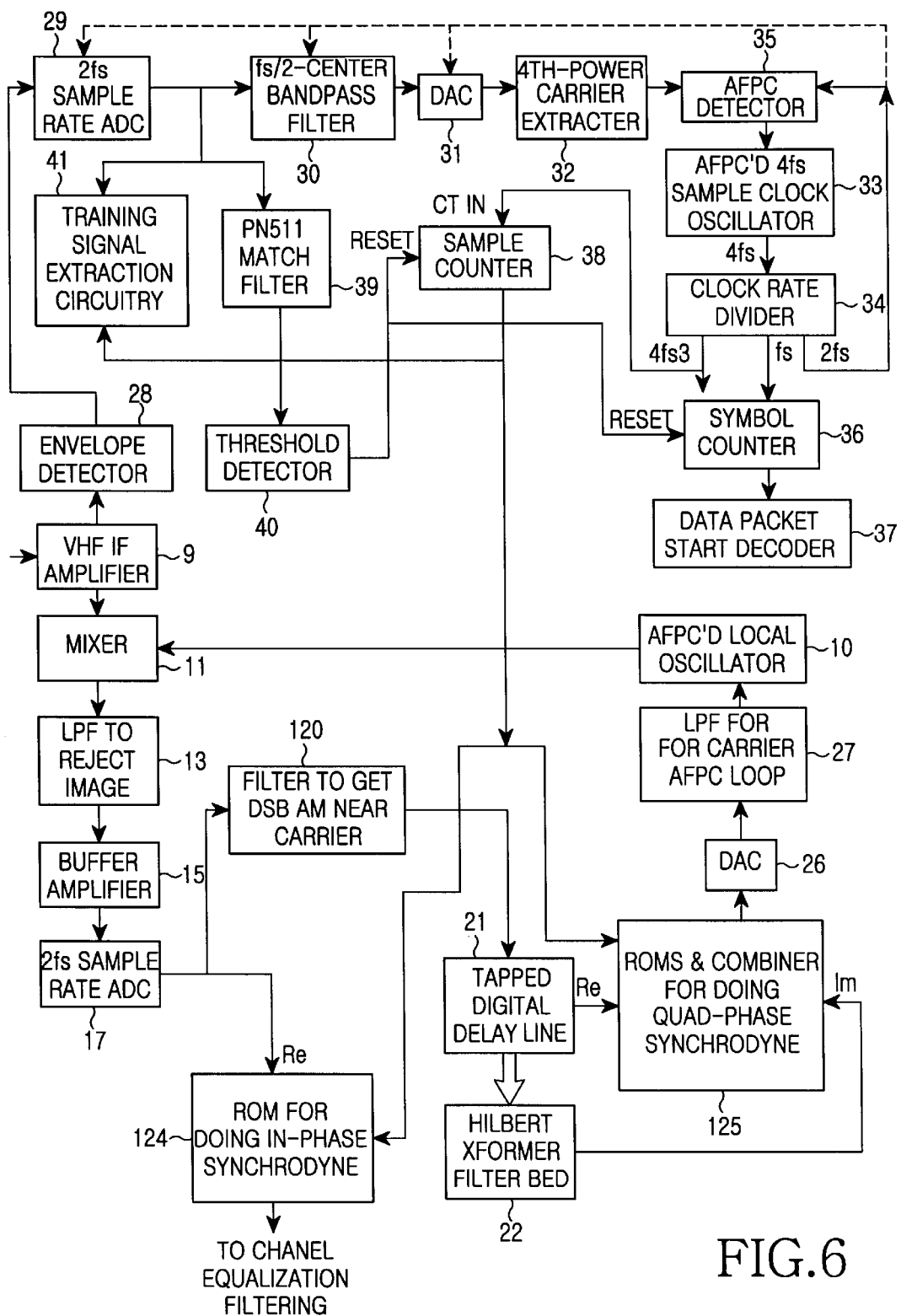

FIG. 6 shows a modification of the FIG. 2 portions of a VSB DTV receiver to be used in designs in which the filtering that determines the VHF intermediate-amplifier passband establishes the slope through the carrier region of the final I-F signal supplied to in-phase synchrodyne circuitry 124. The ADC 17 output signal is supplied to the in-phase synchrodyne circuitry 124 for demodulation without the spectral response of the ADC 17 output signal being further rolled off in the carrier region by the filter 19. The filter 20 used to obtain a flat spectrum through the carrier region to improve the response of the AFPC loop including the quadrature-phase synchrodyne circuitry 125 is replaced by the filter 120 that reduces roll-off of the vestigial sideband response even more, to compensate for the roll-off in the VHF I-F amplifier as well as the roll-off at the transmitter.

Figure 7:
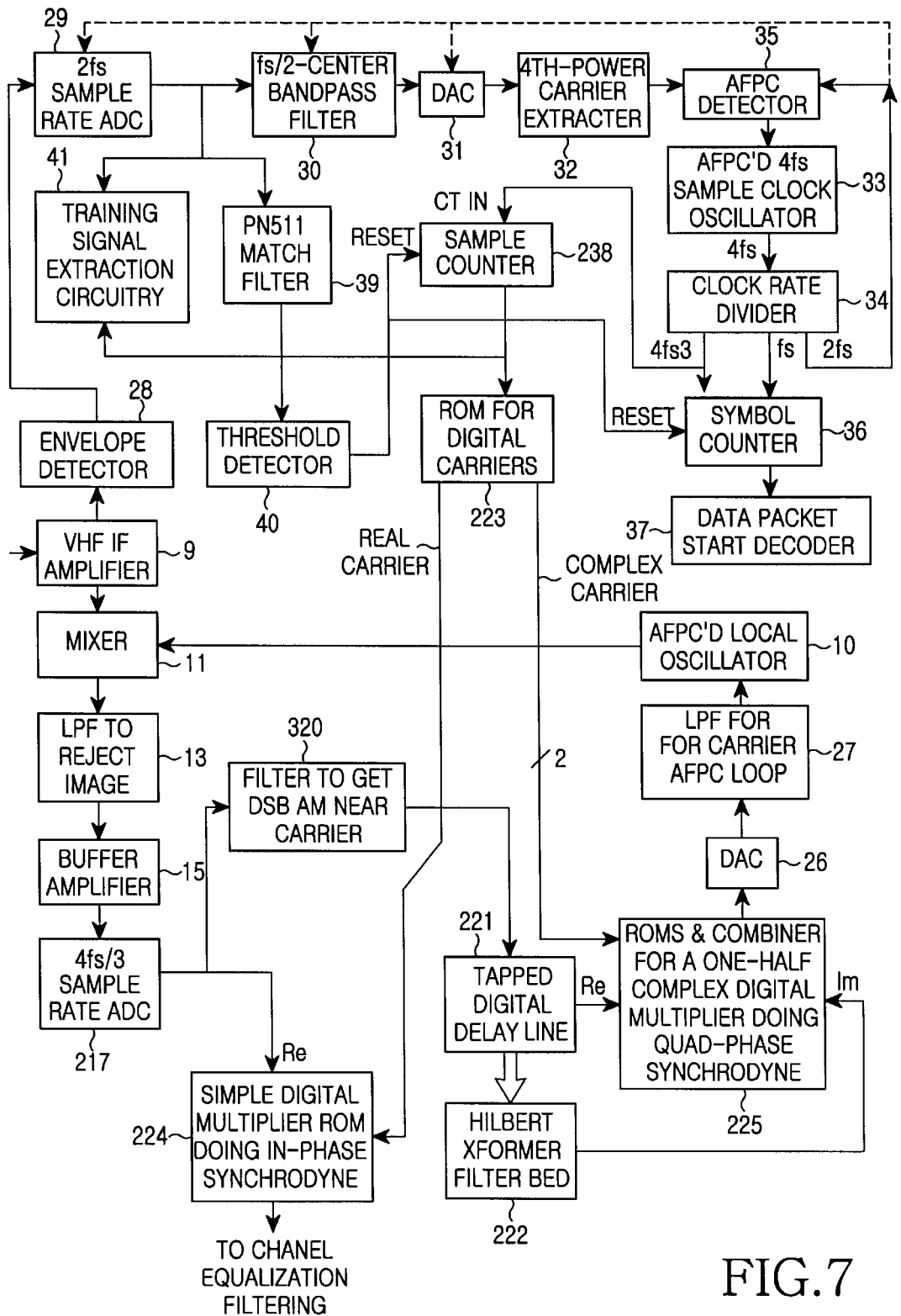

FIG. 7 shows a modification of the FIG. 3 portions of a VSB DTV receiver to be used in designs in which the filtering that determines the VHF intermediate-amplifier passband establishes the slope through the carrier region of the final I-F signal supplied to in-phase synchrodyne circuitry 224. The ADC 217 output signal is supplied to the in-phase synchrodyne circuitry 224 for demodulation without the spectral response of the ADC 217 output signal being further rolled off in the carrier region by the filter 219. The filter 220 used to obtain a flat spectrum through the carrier region to improve the response of the AFPC loop including the quadrature-phase synchrodyne circuitry 225 is replaced by a filter 320 that reduces roll-off of the vestigial sideband response even more, to compensate for the roll-off in the VHF I-F amplifier as well as the roll-off at the transmitter.

Figure 8:
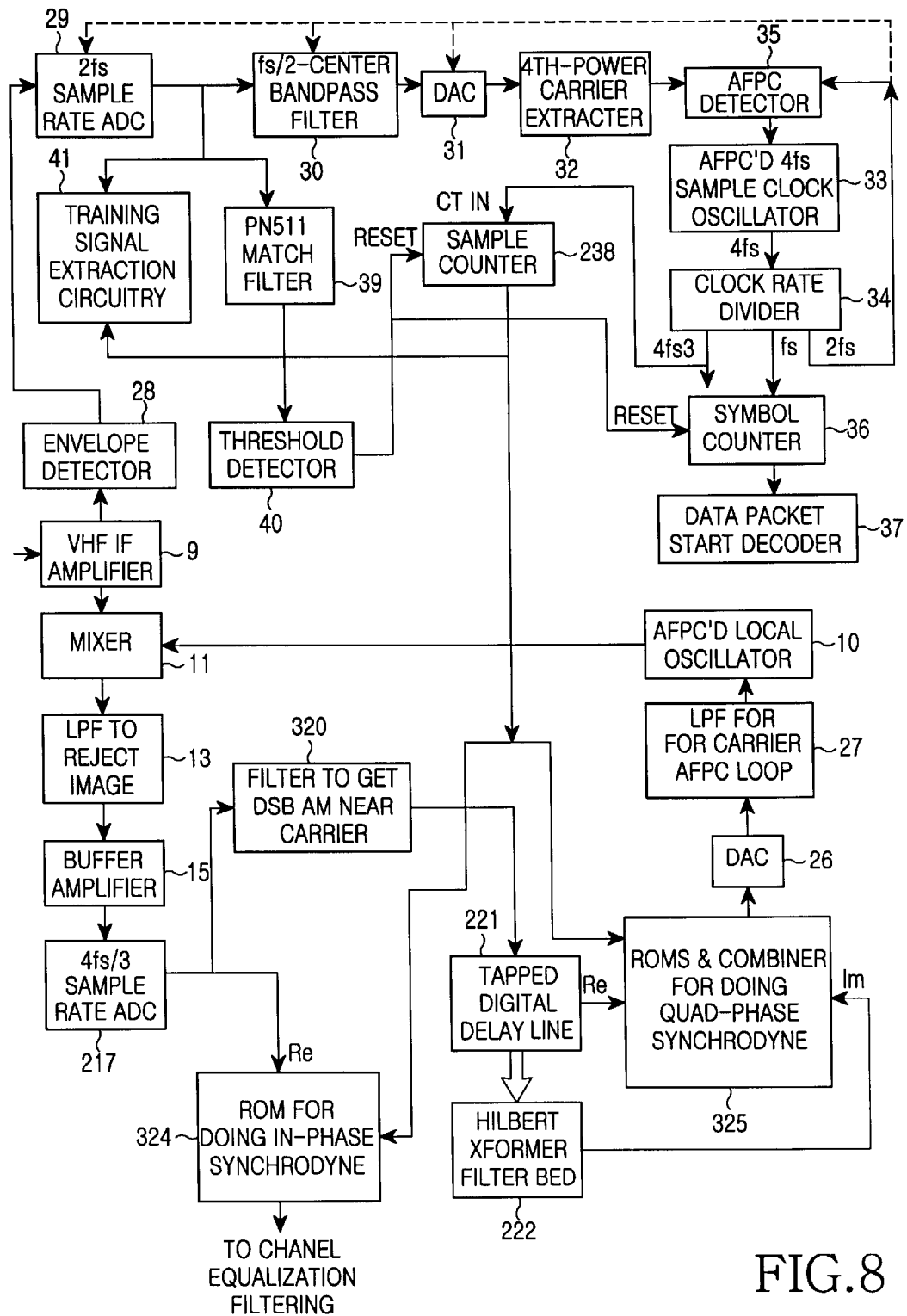

FIG. 8 shows a modification of the FIG. 4 portions of a VSB DTV receiver to be used in designs in which the filtering that determines the VHF intermediate-amplifier passband establishes the slope through the carrier region of the final I-F signal supplied to in-phase synchrodyne circuitry 324. The ADC 217 output signal is supplied to the in-phase synchrodyne circuitry 324 for demodulation without the spectral response of the ADC 217 output signal being further rolled off in the carrier region by the filter 219. The filter 220 used to obtain a flat spectrum through the carrier region to improve the response of the AFPC loop including the quadrature-phase synchrodyne circuitry 325 is replaced by the filter 320 that reduces roll-off of the vestigial sideband response even more, to compensate for the roll-off in the VHF I-F amplifier as well as the roll-off at the transmitter.

Automatic-frequency-and-phase-control circuitry responsive to the error signal extracted from the quadrature-phase synchronous detection signal for completing an AFPC loop that controls the frequency and phase of the local oscillator 10 is shown in FIGS. 1–8 as comprising the digital-to-analog converter 26 and lowpass filter 27 in cascade connection for generating an analog automatic-frequency-and-phase-control signal to the local oscillator 10. Other known types of AFPC circuitry can be used in other embodiments of the invention. Lowpass filtering can be done in part in the digital regime, for example. In another alternative the local oscillator 10 can be a digitally controlled type with lowpass filtering being done entirely within the digital regime, and without the ADC 26 being used.

What is claimed is:

1. A receiver for a baseband symbol code designed to have a spectrum reaching at least substantially to zero-frequency and transmitted by vestigial-sideband amplitude modulation of a suppressed carrier wave so as to have an asymmetrical channel response even in a narrow-frequency band including a pilot carrier signal at the frequency of said suppressed carrier wave, said receiver comprising:

a local oscillator responsive to an automatic frequency and phase control signal for generating local oscillations used in detecting said vestigial-sideband amplitude modulation;

a mixer for heterodyning said local oscillations with vestigial-sideband amplitude modulation of a suppressed carrier wave to generate a final intermediate-frequency signal;

an analog-to-digital converter for digitizing said final intermediate-frequency signal to generate a digitized final intermediate-frequency signal;

real-only digital synchrodyne means for synchrodyning said digitized final intermediate-frequency signal only with a real digital carrier; and quadrature synchrodyne means for producing said automatic frequency and phase control signal.

2. The receiver of claim 1, wherein said real-only digital synchrodyne means comprises a simple digital multiplier for multiplying said digitized final intermediate-frequency signal by said real digital carrier.

3. The receiver of claim 2, wherein said simple digital multiplier comprises a read-only memory arranged for look-up-table multiplication of said digitized final intermediate-frequency signal by said real digital carrier.

4. The receiver of claim 2, said quadrature synchrodyne means comprising:

filtering means for providing double-sideband amplitude modulation near carrier of said digitized final intermediate-frequency signal;

means for generating a complex digitized final intermediate-frequency signal in response to an output of said filtering means;

means for multiplying said complex digitized final intermediate-frequency signal by a complex digital carrier to produce a quadrature-phase synchronous detection signal; and automatic frequency and phase control means responsive to an error signal extracted from said quadrature-phase synchronous detection signal for generating said automatic frequency and phase control signal to control the frequency and phase of said local oscillator.

5. The receiver of claim 4, wherein said automatic frequency and phase control means comprises:

a digital-to-analog converter for converting said error signal to an analog error signal; and a lowpass filter in responsive to said analog error signal for generating said automatic frequency and phase control signal.

6. The receiver of claim 4, wherein said means for multiplying said complex digitized final intermediate-frequency signal by a complex digital carrier comprises:

first and second read-only memories for respectively multiplying the real and imaginary components of said complex digitized final intermediate-frequency signal by respective real and imaginary components of said complex digital carrier to generate respective real and imaginary partial products; and a linear combiner for combining said real and imaginary partial products to generate said quadrature-phase synchronous detection signal.

7. The receiver of claim 6, wherein said first and second read-only memories are simple multipliers, said first read-only memory being arranged for look-up-table multiplication of said real component of said complex digitized final intermediate-frequency signal by said real component of said complex digital carrier, and said second read-only memory being arranged for look-up-table multiplication of said imaginary component of said complex digitized final intermediate-frequency signal by said imaginary component of said complex digital carrier.

8. The receiver of claim 1, further comprising:

an envelope detector for generating an envelope detection response to the vestigial-sideband amplitude modulation of said suppressed carrier wave supplied to said mixer for heterodyning with said local oscillations;

a filter for selecting a submultiple of a baud rate from said envelope detection response;

a sample clock generator for generating sample clock signals at a multiple of said submultiple of the baud rate, the frequency of said clock signals exceeding said baud rate;

a sample counter for counting said sample clock signals to generate a sample count; and a carrier memory addressed by said sample count for supplying said real digital carrier to said real-only digital synchrodyne means.

9. The receiver of claim 8, wherein said real-only digital synchrodyne means comprises a simple digital multiplier for multiplying said digitized final intermediate-frequency signal by said real digital carrier.

10. The receiver of claim 9, wherein said simple multiplier comprises a read-only memory arranged for look-up-table multiplication of said digitized final intermediate-frequency signal by said real digital carrier.

11. The receiver of claim 1, said quadrature synchrodyne means comprising:

filtering means for providing double-sideband amplitude modulation near carrier of said digitized final intermediate-frequency signal;

means for generating a complex digitized final intermediate-frequency signal in response to an output of said filtering means;

means for multiplying said complex digitized final intermediate-frequency signal by a complex digital carrier to produce a quadrature-phase synchronous detection signal; and automatic frequency and phase control means responsive to an error signal extracted from said quadrature-phase synchronous detection signal for generating said automatic frequency and phase control signal to control the frequency and phase of said local oscillator.

12. The receiver of claim 11, further comprising:

an envelope detector for generating an envelope detection response to the vestigial-sideband amplitude modulation of said suppressed carrier wave supplied to said mixer for heterodyning with said local oscillations;

a filter for selecting a submultiple of a baud rate from said envelope detection response;

a sample clock generator for generating sample clock signals at a multiple of said submultiple of the baud rate, the frequency of said clock signals exceeding said baud rate;

a sample counter for counting said sample clock signals to generate a sample count; and a carrier memory addressed by said sample count for supplying said real digital carrier to said real-only digital synchrodyne means and supplying said complex digital carrier to said means for multiplying said complex digitized final intermediate-frequency signal by said complex digital carrier.

13. A receiver for a baseband symbol code designed to have a spectrum reaching at least substantially to zero-frequency and transmitted by vestigial-sideband amplitude modulation of a suppressed carrier wave so as to have an asymmetrical channel response even in a narrow-frequency band including a pilot carrier signal at the frequency of said suppressed carrier wave, said receiver comprising:

a local oscillator responsive to an automatic frequency and phase control signal for generating local oscillations used in detecting said vestigial-sideband amplitude modulation;

a mixer for heterodyning said local oscillations with vestigial-sideband amplitude modulation of a suppressed carrier wave to generate a final intermediate-frequency signal;

an envelope detector for generating an envelope detection response to the vestigial-sideband amplitude modulation of said suppressed carrier wave supplied to said mixer for heterodyning with said local oscillations;

a filter for selecting a submultiple of a baud rate from said envelope detection response;

a sample clock generator for generating sample clock signals at a multiple of said submultiple of the baud rate, the frequency of said clock signals exceeding said baud rate;

a sample counter for counting said sample clock signals to generate a sample count;

a carrier memory addressed by said sample count for producing a real digital carrier;

an analog-to-digital converter for digitizing said final intermediate-frequency signal to generate a digitized final intermediate-frequency signal;

real-only digital synchrodyne means for synchrodyning said digitized final intermediate-frequency signal only with said real digital carrier; and quadrature synchrodyne means for producing said automatic frequency and phase control signal.

14. The receiver of claim 13, said quadrature synchrodyne means comprising: filtering means for providing double-sideband amplitude modulation near carrier of said digitized final intermediate-frequency signal;

means for generating a complex digitized final intermediate-frequency signal in response to an output of said filtering means;

means for multiplying said complex digitized final intermediate-frequency signal by a complex digital carrier to produce a quadrature-phase synchronous detection signal; and automatic frequency and phase control means responsive to error signal extracted from said quadrature-phase synchronous detection signal for generating said automatic frequency and phase control signal to control the frequency and phase of said local oscillator.

15. The receiver of claim 14, wherein said carrier memory addressed by said sample count produces said complex digital carrier.

16. A receiver for a baseband symbol code designed to have a spectrum reaching at least substantially to zero-frequency and transmitted by vestigial-sideband amplitude modulation of a suppressed carrier wave so as to have an asymmetrical channel response even in a narrow-frequency band including a pilot carrier signal at the frequency of said suppressed carrier wave, said receiver comprising:

a local oscillator responsive to an automatic frequency and phase control signal for generating local oscillations used in detecting said vestigial-sideband amplitude modulation;

a mixer for heterodyning said local oscillations with vestigial-sideband amplitude modulation of a suppressed carrier wave to generate a final intermediate-frequency signal;

an envelope detector for generating an envelope detection response to the vestigial-sideband amplitude modulation of said suppressed carrier wave supplied to said mixer for heterodyning with said local oscillations;

a filter for selecting a submultiple of a baud rate from said envelope detection response;

a sample clock generator for generating sample clock signals at a multiple of said submultiple of the baud rate, the frequency of said clock signals exceeding said baud rate;

a sample counter for counting said sample clock signals to generate a sample count;

an analog-to-digital converter for digitizing said final intermediate-frequency signal to generate a digitized final intermediate-frequency signal;

real-only digital synchrodyne means for synchrodyning said digitized final intermediate-frequency signal with least significant bits of said sample count; and quadrature synchrodyne means for producing said automatic frequency and phase control signal.

17. The receiver of claim 16, said quadrature synchrodyne means comprising:

filtering means for providing double-sideband amplitude modulation near carrier of said digitized final intermediate-frequency signal;

means for generating a complex digitized final intermediate-frequency signal in response to an output of said filtering means;

means for multiplying said complex digitized final intermediate-frequency signal by said least significant bits of said sample count to produce a quadrature-phase synchronous detection signal; and automatic frequency and phase control means responsive to error signal extracted from said quadrature-phase synchronous detection signal for generating said automatic frequency and phase control signal to control the frequency and phase of said local oscillator.

18. The receiver of claim 17, wherein said means for multiplying said complex digitized final intermediate-frequency signal by said least significant bits of said sample count comprises:

first and second read-only memories respectively addressed by the real and imaginary components of said complex digitized final intermediate-frequency signal and by said least significant bits of said sample count to generate respective real and imaginary partial products; and a linear combiner for combining said real and imaginary partial products to generate said quadrature-phase synchronous detection signal.

19. The receiver of claim 18, wherein said automatic frequency and phase control means comprises:

a digital-to-analog converter for converting said error signal to an analog error signal; and a lowpass filter in responsive to said analog error signal for generating said automatic frequency and phase control signal.

20. The receiver of claim 17, wherein said automatic frequency and phase control means comprises:

a digital-to-analog converter for converting said error signal to an analog error signal; and a lowpass filter in responsive to said analog error signal for generating said automatic frequency and phase control signal.

21. The receiver of claim 16, wherein said real-only digital synchrodyne means comprises a read-only memory addressed by said digitized final intermediate-frequency signal and said least significant bits of said sample count.

* * * * *